United States Patent
Leong et al.

(10) Patent No.: US 11,650,246 B1
(45) Date of Patent: May 16, 2023

(54) LOCALIZED ONBOARD SOCKET HEATING ELEMENTS FOR BURN-IN TEST BOARDS

(71) Applicant: WESTERN DIGITAL TECHNOLOGIES, INC., San Jose, CA (US)

(72) Inventors: Tony Leong, San Jose, CA (US); Athipat Ratanavarinchai, Sunnyvale, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 17/591,129

(22) Filed: Feb. 2, 2022

(51) Int. Cl.
| | |
|---|---|
| *G01R 31/00* | (2006.01) |
| *G01R 31/28* | (2006.01) |
| *G01R 1/073* | (2006.01) |
| *H01R 12/88* | (2011.01) |
| *H01R 12/70* | (2011.01) |
| *G01R 1/04* | (2006.01) |

(52) U.S. Cl.
CPC ..... *G01R 31/2875* (2013.01); *G01R 1/07314* (2013.01); *G01R 31/2831* (2013.01); *G01R 31/2863* (2013.01); *G01R 31/2886* (2013.01); *H01R 12/7076* (2013.01); *H01R 12/88* (2013.01); *G01R 1/0483* (2013.01); *G01R 31/2856* (2013.01); *G01R 31/2879* (2013.01)

(58) Field of Classification Search
CPC ............ G01R 31/2875; G01R 1/07314; G01R 31/2863; G01R 31/2831; G01R 31/2886; G01R 1/0483; G01R 31/2856; G01R 31/2879; H01R 12/7076; H01R 12/88
USPC ......... 324/71, 378, 403, 415, 425, 500, 537, 324/750.01, 750.03, 750.05
See application file for complete search history.

(56) References Cited

U.S. PATENT DOCUMENTS

| | | | |
|---|---|---|---|
| 5,273,441 A | 12/1993 | Volz et al. | |
| 7,114,976 B2 | 10/2006 | Cram | |
| 2005/0206368 A1 | 9/2005 | Lopez et al. | |
| 2017/0010305 A1* | 1/2017 | Liao | G01R 31/2875 |
| 2021/0156891 A1* | 5/2021 | Kobayashi | G01R 31/2865 |
| 2021/0302492 A1* | 9/2021 | Endo | G01R 31/2865 |

FOREIGN PATENT DOCUMENTS

| | | |
|---|---|---|
| CN | 101769985 | 7/2012 |
| KR | 102292034 | 8/2021 |

OTHER PUBLICATIONS

International Search Report and Written Opinion dated Nov. 1, 2022 in International Patent Application No. PCT/US2022/030412.
English language Abstract for CN101769985 published Jul. 4, 2012.
English language Abstract for KR102292034 published Aug. 23, 2021.

\* cited by examiner

*Primary Examiner* — Raul J Rios Russo
(74) *Attorney, Agent, or Firm* — Vierra Magen Marcus LLP

(57) ABSTRACT

A burn-in board for testing the operational integrity of memory devices includes local heating elements for each memory device under test. Each socket on the burn-in board may include a pair of opposed latch heads which move between open positions allowing a memory device to be mounted in the socket, and closed positions where the latch heads rest against the memory device to secure the device in the socket. Local heating elements may be integrated into the latch heads to ensure even heating of each memory device in the burn-in board.

20 Claims, 11 Drawing Sheets

LOCALIZED ONBOARD SOCKET HEATING ELEMENTS FOR BURN-IN TEST BOARDS

BACKGROUND

The strong growth in demand for portable consumer electronics is driving the need for high-capacity storage devices. Non-volatile semiconductor memory devices, such as flash memory storage cards, are widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, cellular telephones and SSDs (Solid State Drives).

Although fabrication techniques continue to improve for such memory devices, occasionally a memory device is fabricated with a component that becomes non-functional early within the life of the memory device. For example, an insulating oxide layer between two conductors may be excessively thin in a particular region. Voltage and temperature stress will cause the particular region of excessively thin insulating oxide to break down, resulting in a short circuit between the two conductors. Irregularities such as these may be identified via "burn-in" testing that includes performing data write and erase operations to sections of the memory at elevated temperatures, followed by a data integrity check.

In practice, multiple memory devices may be mounted to a burn-in board, which includes an X-Y array of sockets to mount the individual memory devices to the board. Multiple such burn-in boards may then be placed in an oven, so that the write/erase testing operations may be performed at an elevated temperature.

Burn-in test ovens typically operate by convection heating, blowing hot gas over the burn-in board from opposed edges of the board. With a large X-Y array of memory devices under test, it has become difficult to keep the temperature across each of the memory devices uniform. This could lead to over temperature-stressing of devices near edges of the board, while under stressing other devices near the center of the board.

DETAILED DESCRIPTION

Figure 1:
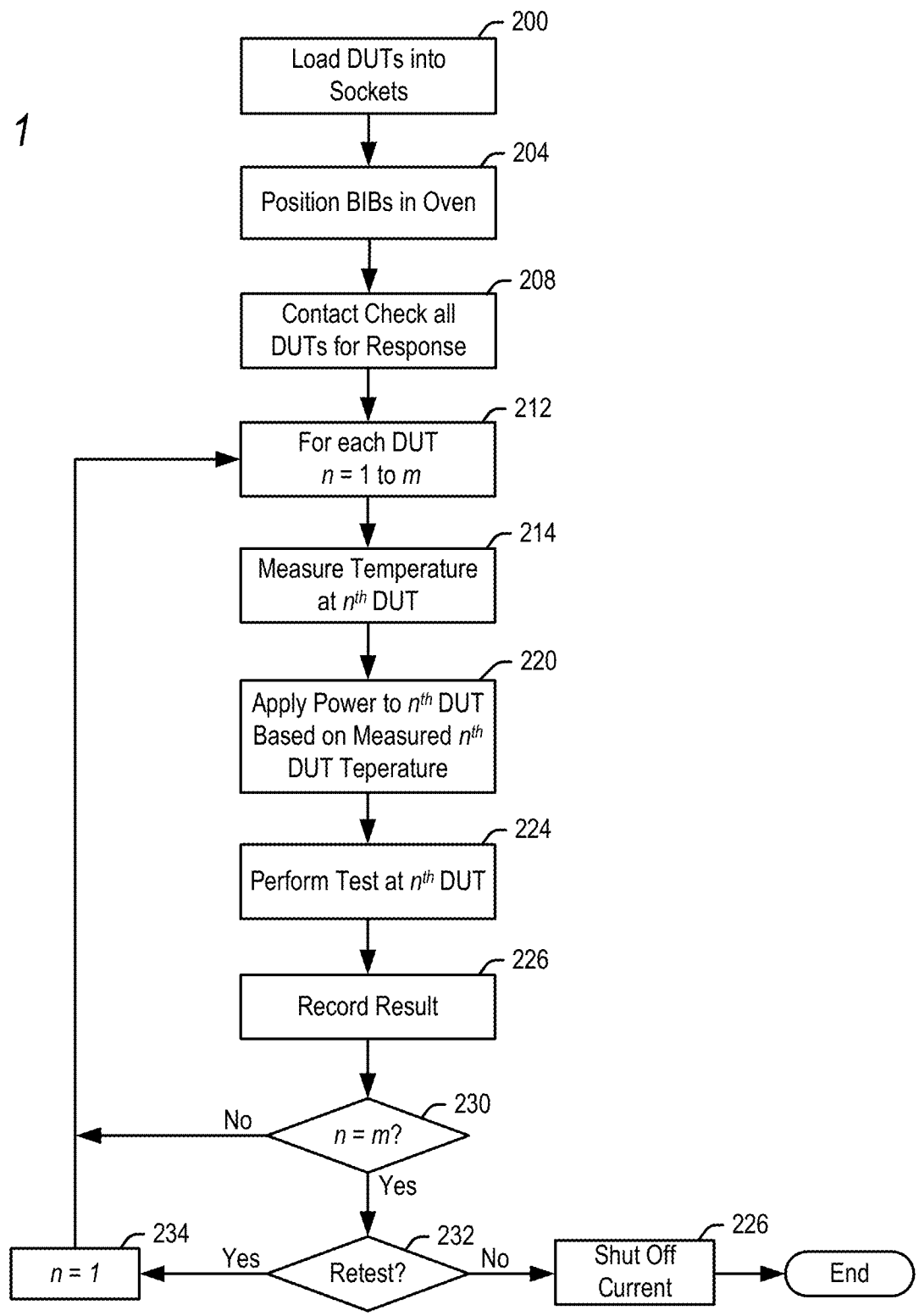
FIG. 1 is a flowchart for a burn-in test procedure according to embodiments of the present technology.

The present technology will now be described with reference to the figures, which in embodiments, relate to a burn-in board ("BIB") for testing the operational integrity of memory devices. The BIB of the present technology includes local heating elements for each memory device under test ("DUT"). Each socket on the BIB may include a pair of opposed latch heads which move between open positions allowing a DUT to be inserted into and removed from the socket, and closed positions where the latch heads rest against the DUT to clamp the DUT in the socket. In accordance with the present technology, local heating elements may be integrated into the latch heads to ensure even and controlled heating of each DUT on the BIB.

In embodiments, each local heating element may be a resistor, or bank of resistors, which heat upon receiving an electrical current. The current may be supplied to the local heating elements a number of ways. In one example, each latch head may actuate a pogo pin integrated into the DUT socket when closed over a DUT. Actuation of the pogo pin may start the flow of current through the local heating elements on the latch heads.

It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

The terms "top" and "bottom," "upper" and "lower" and "vertical" and "horizontal," and forms thereof, as may be used herein are by way of example and illustrative purposes only, and are not meant to limit the description of the technology inasmuch as the referenced item can be exchanged in position and orientation. Also, as used herein, the terms "substantially" and/or "about" mean that the specified dimension or parameter may be varied within an acceptable manufacturing tolerance for a given application. In one embodiment, the acceptable manufacturing tolerance is ±1.5 mm, or alternatively, ±2.5% of a given dimension.

For purposes of this disclosure, a connection may be a direct connection or an indirect connection (e.g., via one or more other parts). In some cases, when a first element is referred to as being connected, affixed, mounted or coupled to a second element, the first and second elements may be directly connected, affixed, mounted or coupled to each other or indirectly connected, affixed, mounted or coupled to each other. When a first element is referred to as being directly connected, affixed, mounted or coupled to a second element, then there are no intervening elements between the first and second elements (other than possibly an adhesive or melted metal used to connect, affix, mount or couple the first and second elements).

Figure 2:
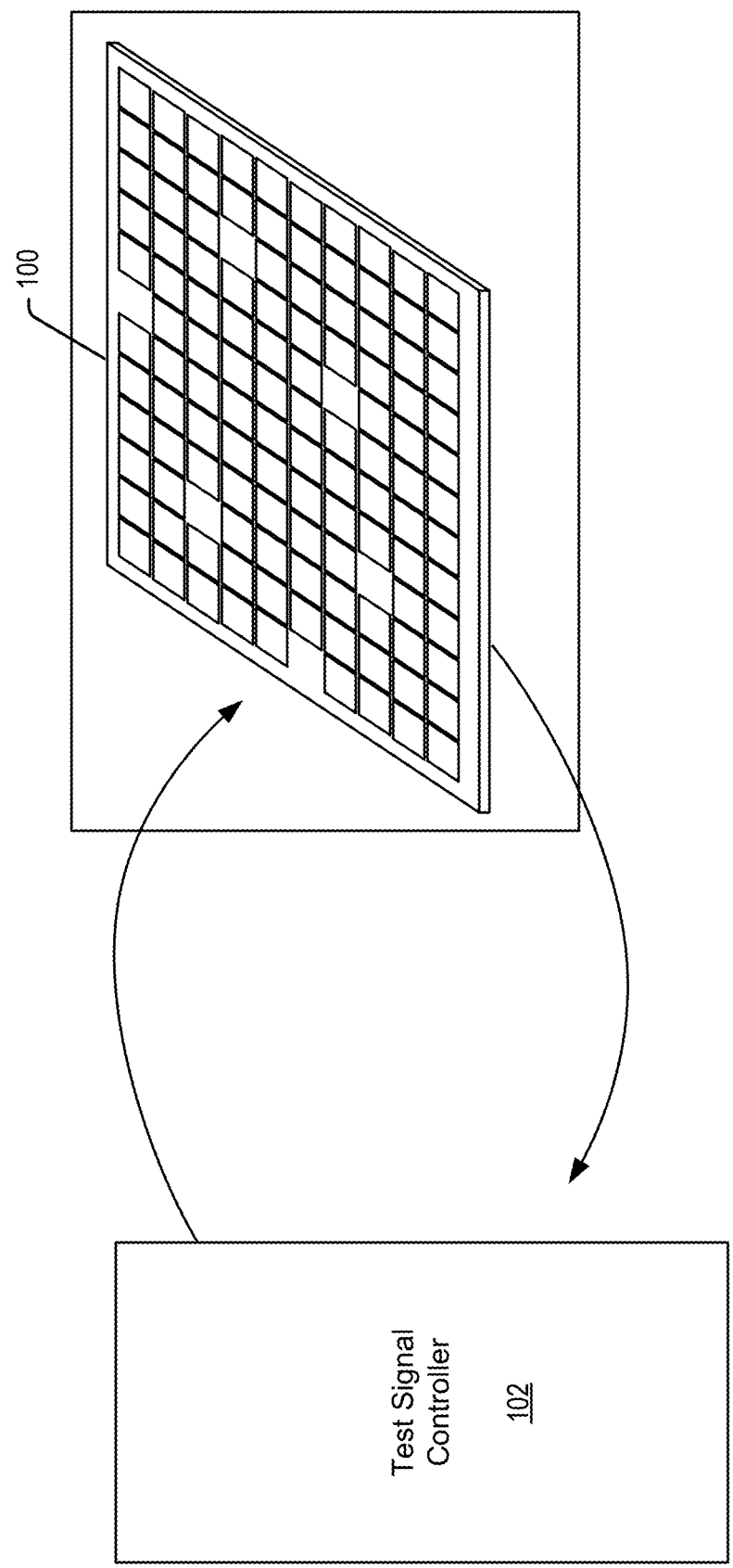
FIG. 2 is a perspective view of a burn-in board and test signal controller according to embodiments of the present technology.
Figure 3:
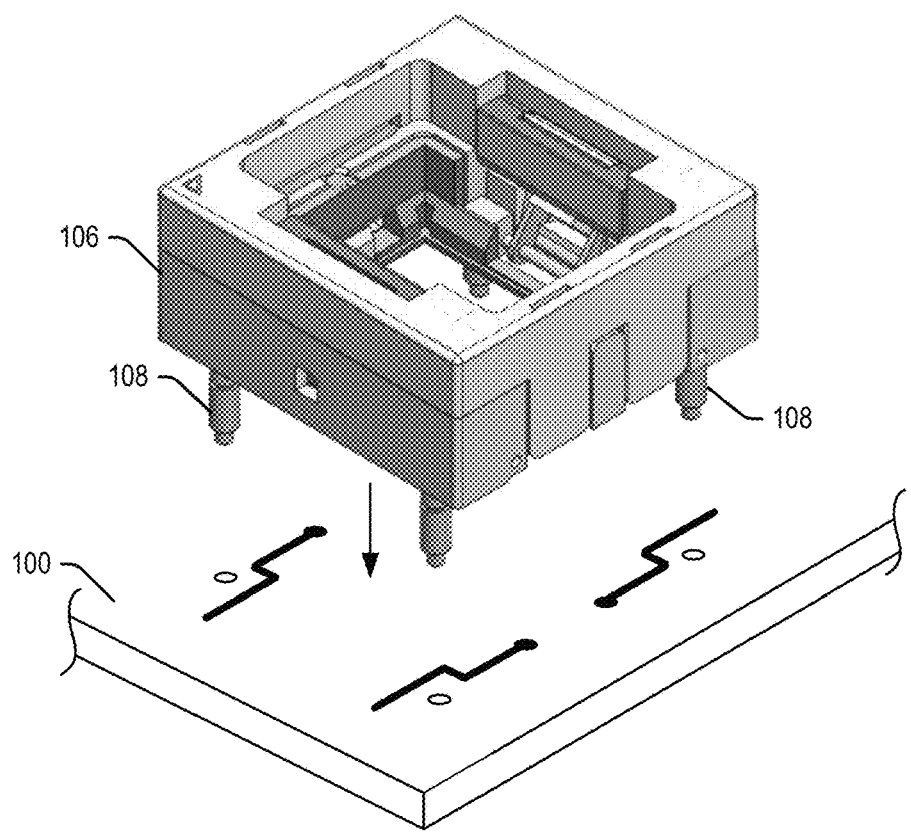
FIG. 3 is a perspective view of a socket to be mounted on a burn-in board according to embodiments of the present technology.
Figure 4:
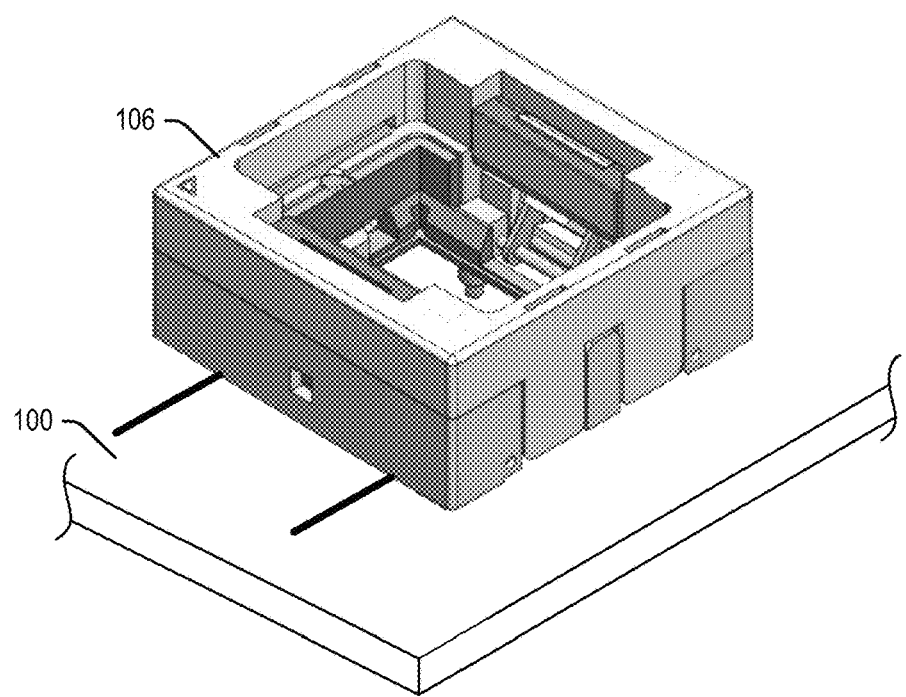
FIG. 4 is a perspective view of a socket mounted on a burn-in board according to embodiments of the present technology.

An embodiment of the present technology will now be explained with reference to the flowchart of FIG. 1 and the side and perspective views of FIGS. 2 through 15. In step 200, the DUTs are loaded onto a burn-in board. Although not critical to the present technology, the DUTs may be BGA memory devices such as 2D NAND flash memory or 3D BiCS (Bit Cost Scaling), V-NAND or other 3D flash memory. FIG. 2 is a perspective view of a burn-in test set up, including a burn-in board 100 and a test signal controller 102 (shown schematically). The burn-in board 100 of FIG. 2 is by way of example only, and the size and number of DUTs may vary in further embodiments. The individual DUTs are mounted within sockets on the BIB 100 as shown for example in FIGS. 3 and 4. FIG. 3 shows the socket 106 including posts 108 for mounting the socket 106 onto the BIB 100.

Figure 5:
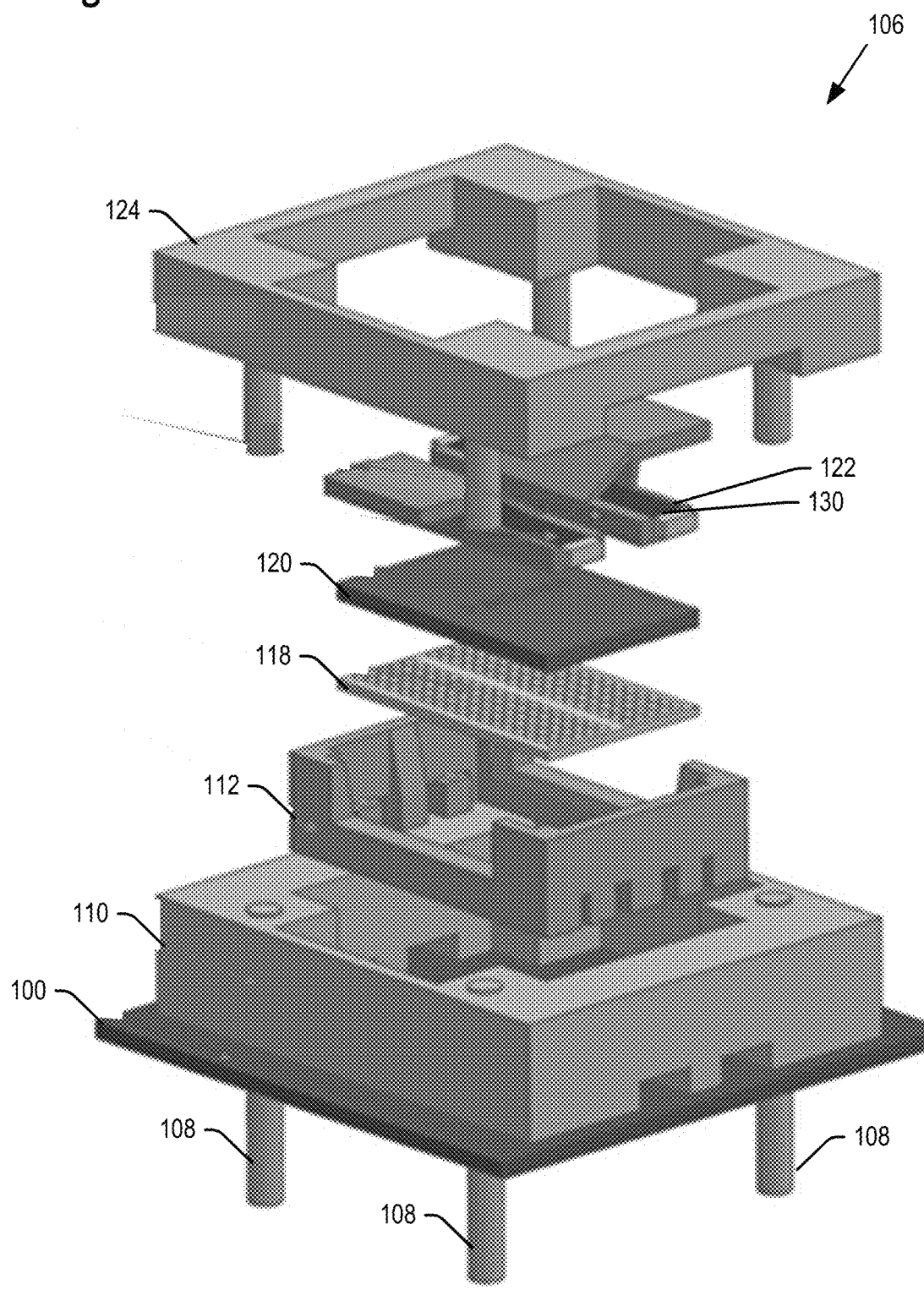
FIG. 5 is an exploded perspective view of a socket according to embodiments of the present technology.

FIG. 5 is an exploded perspective view showing the different components of a socket 106. At the bottom is a lower socket base 110 affixed to the BIB 100. A package insert guide 112 may mount within an interior opening of the lower socket base 110. The package insert guide 112 may be provided to guide the DUT into the socket as explained below. The package insert guide 112 may further include pogo pins for activating current to the local heating elements within the socket as is also explained below.

An interposer 118 may in turn mount within an interior opening of the package insert guide 112. The interposer 118 has electrical contacts on first and second opposed sides of the interposer, and a redistribution layer (RDL) for electrically coupling the electrical contacts on the first side with the electrical contacts on the second side. The electrical contacts on the first side of the interposer 118 are configured to mate with test pads on the DUT 120. The electrical contacts on the second side of the interposer 118 are configured to mate with contact pads on the BIB 100. The interposer 118 is used to transfer the test signals and response signals between the DUT 120 and the BIB 100.

Figure 6:
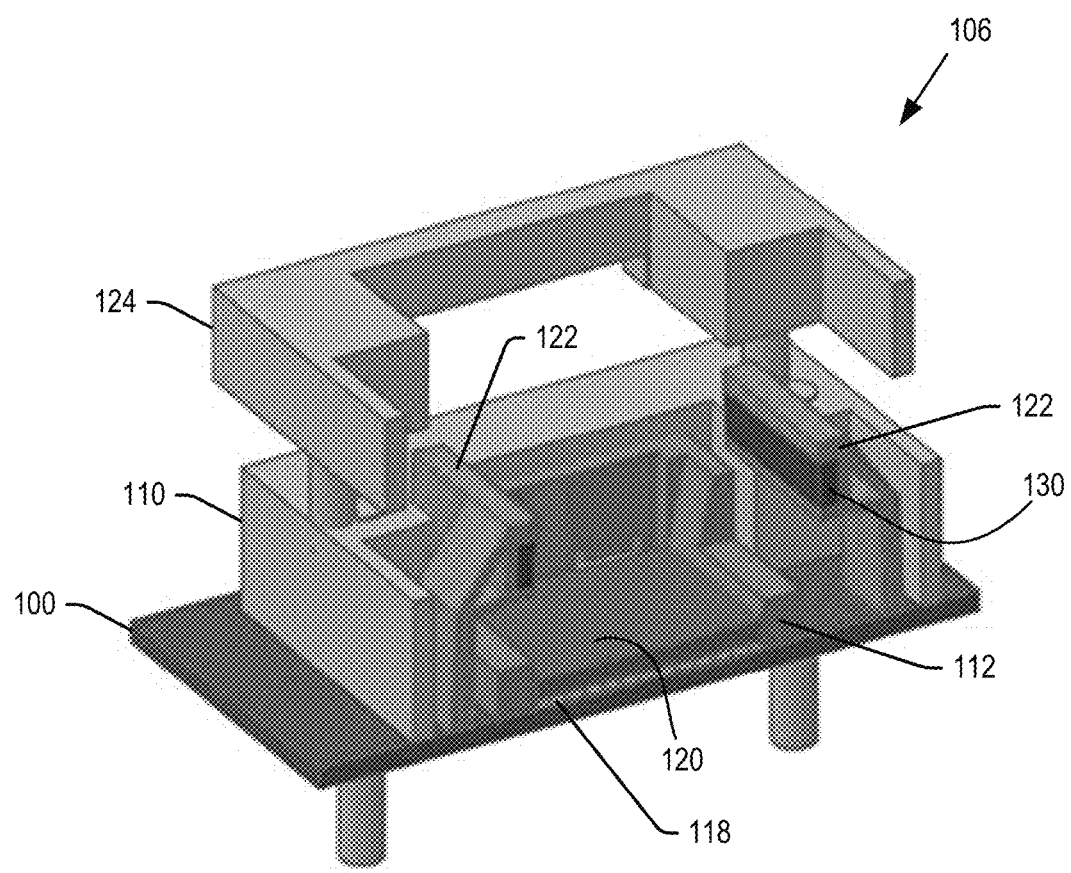
FIG. 6 is a cross-sectional view of a socket with the latch heads in an open position according to embodiments of the present technology.
Figure 7:
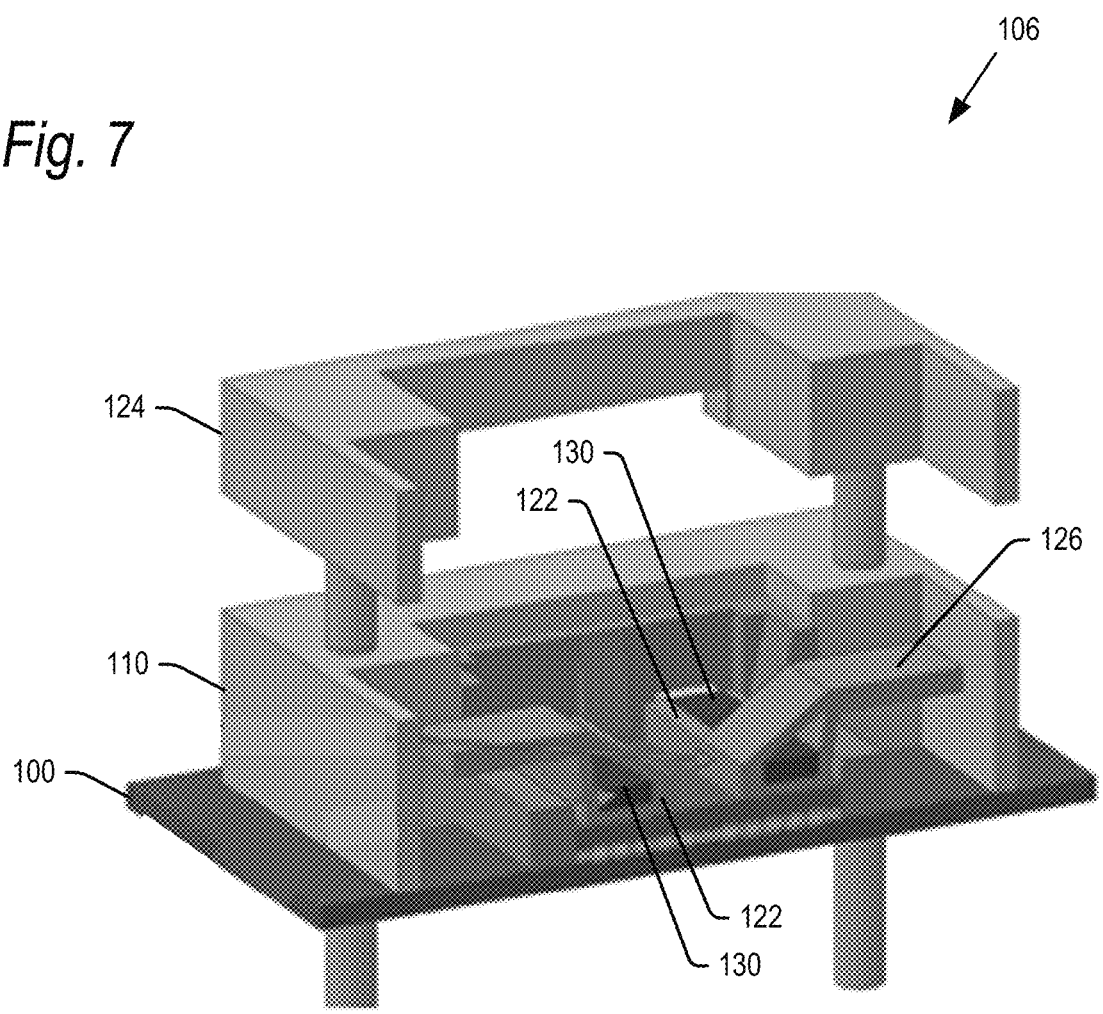
FIG. 7 is a cross-sectional view of a socket with the latch heads in a closed position according to embodiments of the present technology.

The socket 106 further includes a pair of latch heads 122 configured to move between an open position shown in FIG. 6 for receiving and removing the DUT, and a closed position shown in FIG. 7 against an upper surface of the DUT. The latch heads 122 clamp the DUT 120 in position in the socket 106 against the interposer 118 when in the closed positions. As shown in FIGS. 6 and 7, the latch heads 122 may be the mirror image of each other, and may rotate from their open positions toward each other to their closed positions against the DUT 120.

Figure 14:
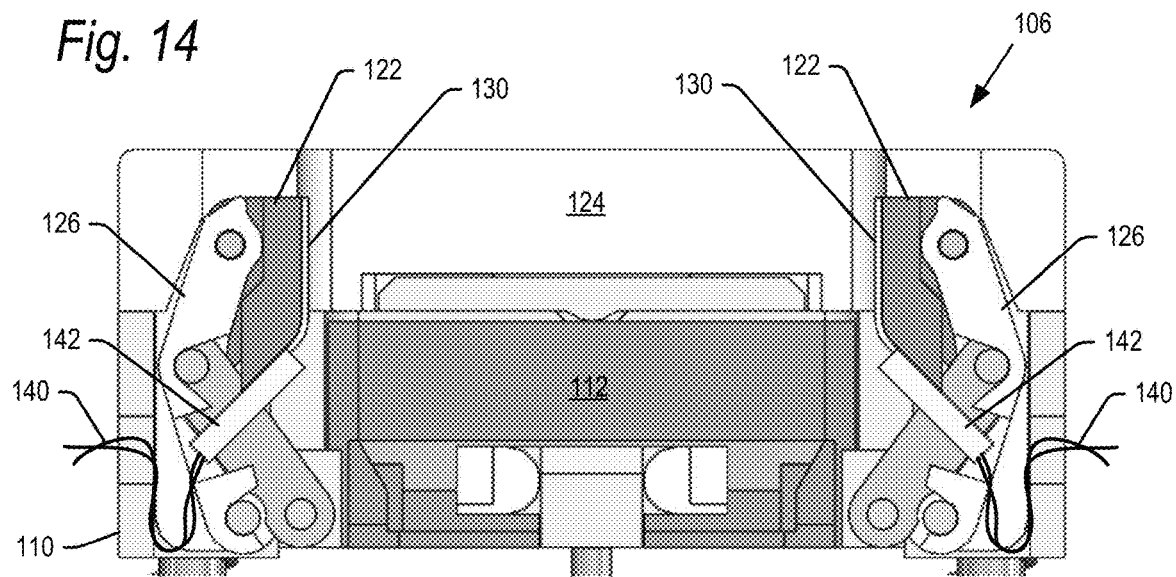
FIG. 14 is a cross-sectional side view of a socket in an open position according to alternative embodiments of the present technology.
Figure 15:
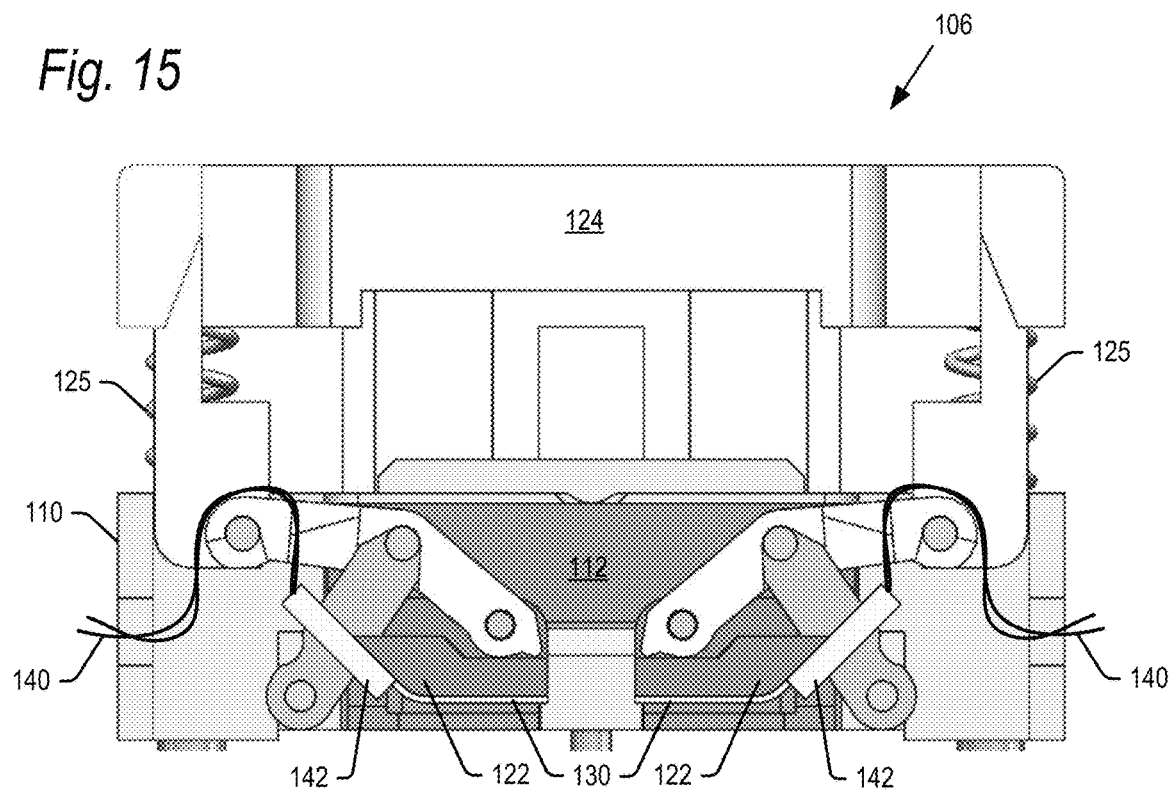
FIG. 15 is a cross-sectional side view of a socket in a closed position according to alternative embodiments of the present technology.

An upper socket 124 may be mounted by pins to the lower socket base 110, which upper socket is configured to move between an open position shown in FIG. 6 for receiving the DUT, and a closed position shown in FIG. 7 near the socket base 110. The upper socket 124 may be equipped with one or more push-to-close latches (not shown), so that the upper socket 124 locks in a closed position when pressed down toward the socket base 110, and once locked, opens when the upper socket 124 is pressed down again. FIGS. 14 and 15, discussed in more detail below, show an embodiment where the upper socket 124 is biased away from the lower socket base 110 by springs 125. When the upper socket 124 is pressed down against the lower base socket 110, the latch heads 122 may be an open position to allow insertion or removal of the DUT. When the upper socket 124 moves away from the lower base socket 110 (as by pressing down on the upper socket), the latch heads 122 are rotated downward against the DUT to clamp the DUT in place in the socket 106. The upper socket 124 may lock in place and release by other mechanisms in further embodiments.

The latch heads 122 may be affixed to arms 126 which are in turn affixed to (or otherwise actuated by) the upper socket 124 (as by linkages). Thus, the arms 126 move the latch heads 122 to their closed positions when the upper socket 124 is moved to its closed position, and the arms 126 move latch heads 122 to their open positions when the upper socket 124 is move to its open position. The upper socket 124 may be an open position against the lower socket base 110, and in a closed position when it is spaced away from the lower socket base, as shown for example in FIGS. 14 and 15.

Figure 8:
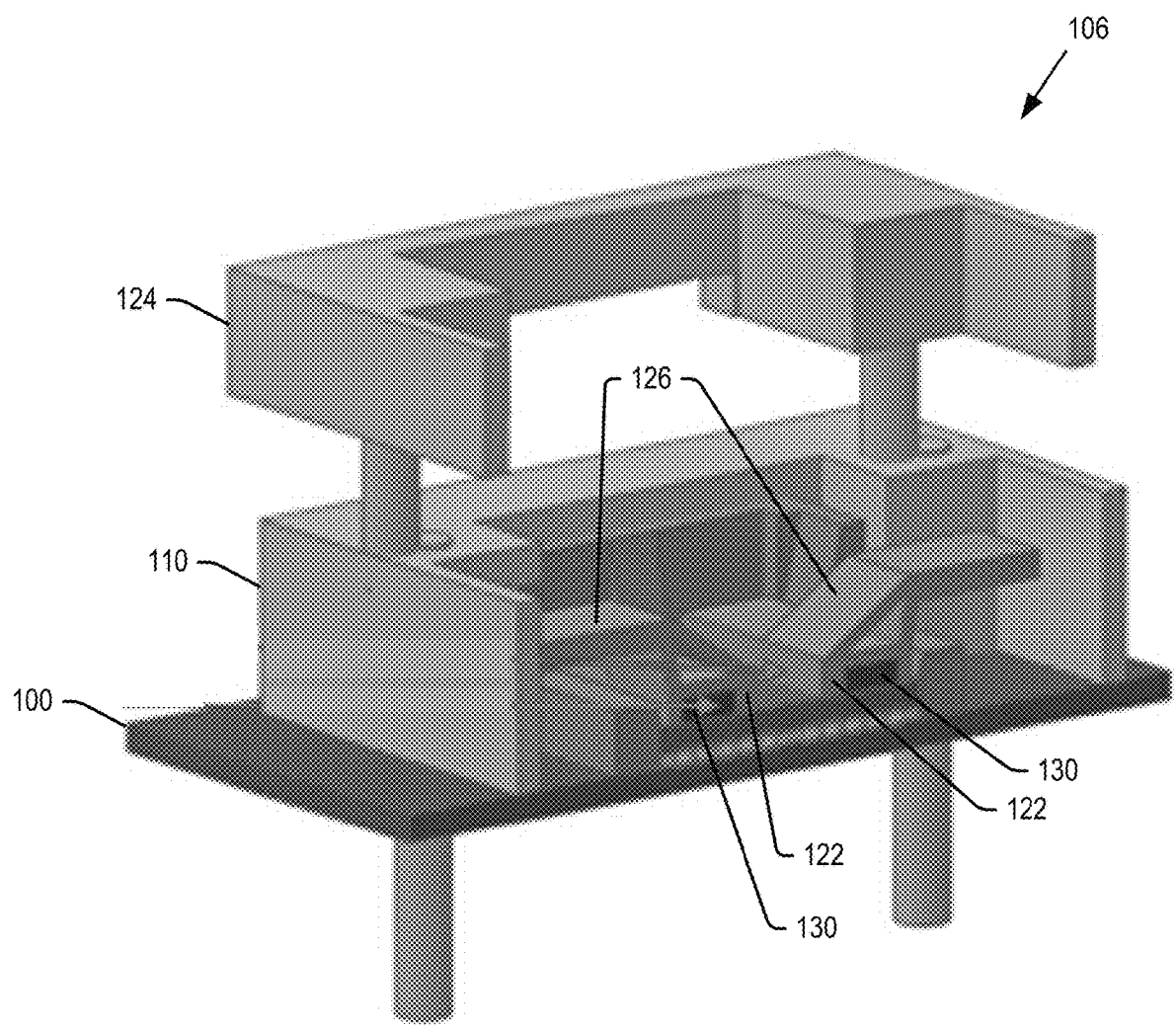
FIG. 8 is a cross-sectional view of a socket including latch heads according to alternative embodiments of the present technology.

In accordance with aspects of the present technology, each of the latch heads 122 may include a local, onboard heating element 130. In one embodiment shown in FIGS. 6 and 7, the upper surfaces of the latch heads 122 (most distal from the DUT when the latch heads are in the closed positions) may be formed with channels within which the heating elements 130 are mounted. In a further embodiment shown in FIG. 8, the heating elements 130 may be embedded at bottom surfaces of the latch heads (proximal to the DUT when the latch heads are in the closed positions). In the embodiment of FIG. 8, channels may be formed in the bottom surfaces of the latch heads 122 so that the heating elements 130 are flush with the bottom surface of the latch heads and rest directly against the DUT when the latch heads 122 are in the closed positions. Alternatively, a bore may be formed through the latch heads and the heating elements 130 placed within these bores so that the heating elements are entirely encased within the latch heads 122.

Figure 10:
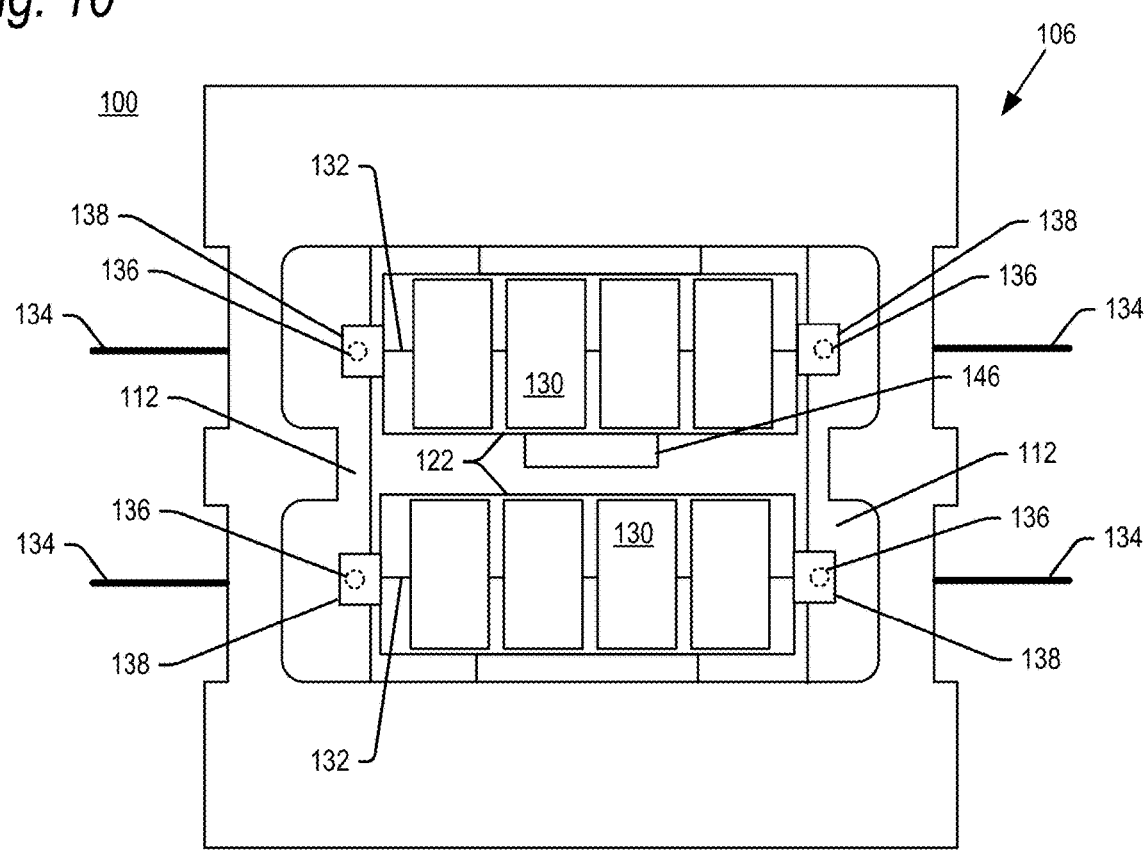
FIG. 10 is a plan view of a socket including latch heads according to embodiments of the present technology.
Figure 11:
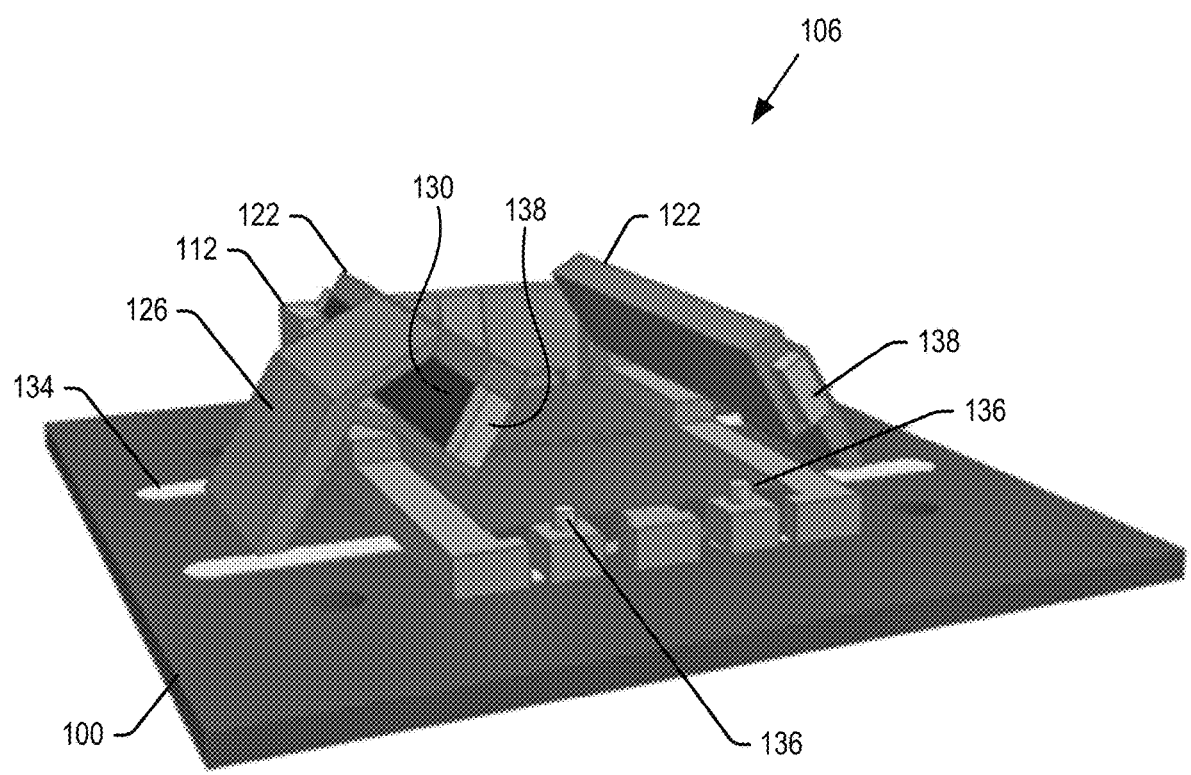
FIG. 11 is a perspective view of a portion of a socket mounted on a burn-in board with the latch heads in an open position according to embodiments of the present technology.
Figure 12:
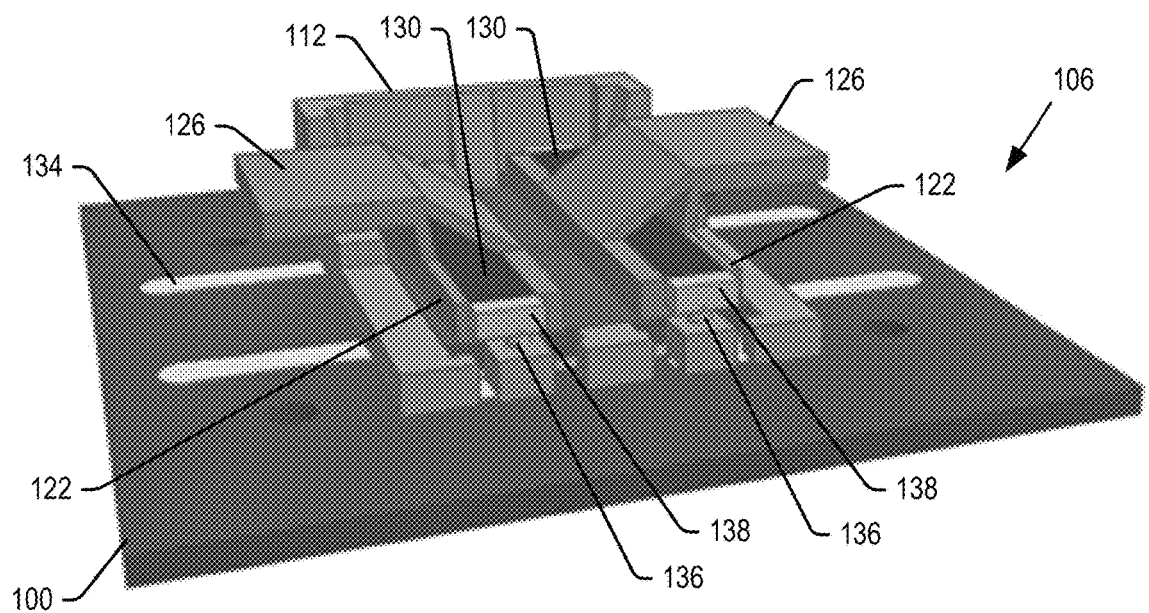
FIG. 12 is a perspective view of a portion of a socket mounted on a burn-in board with the latch heads in a closed position according to embodiments of the present technology.

The heating elements 130 may for example be one or more resistors, but other heating elements may be used, including for example a polyimide coil or conductive wire. FIG. 10 shows a plan view of an example where each of the heat elements 130 comprise four discrete resistors, connected in parallel by a wire 132. The wire 132 may in turn be connected to a current source through the BIB 100 as explained below. It is understood that various electrical connectors may be used instead of wire 132, including for example a printed electrical trace and a flex circuit.

As one example, each discrete heating element shown in FIG. 10 may output 15 W to 150 W of power, using 120 VAC operating voltage at 50-60 Hz. Such heating elements are available for example as model HG 140 from Stego Elektrotechnik GmbH, Schwabisch Hall, Germany. However, it is understood that the heating element(s) 130 may have other specifications and come from other manufacturers in further embodiments.

The heat element 130 in each latch head 122 may be sized at 50% to 95% of the area of the bottom surface of the latch head 122 that comes into contact with the DUT 120.

However, it is understood that the size of the heating element 130 in a latch head may have a relatively smaller or larger size in further embodiments.

The lower socket base 110, package insert guide 112, upper socket 124 and arms 126 (holding the latch heads 128) may all be made of fiberglass or other polymer, though each may be made of other materials in further embodiments. The latch heads 122 may be made of a good thermal conductor such as for example Aluminum, Copper, alloys thereof, or other metals. In embodiments, the latch heads 122 may cover 50% to 95% of the upper surface of the DUT 120 when clamped thereon, though the surface area of the DUT covered by the pair of latch heads 122 may be more or less than this in further embodiments.

Referring again the flowchart of FIG. 1, after the DUTs 120 are mounted within sockets 106 in step 200, one or multiple BIBs 100 may be loaded into an oven in step 204. The BIBs 100 may be loaded in a stacked configuration, with an air gap between each BIB. In step 208, each DUT 120 on the BIBs 100 may be tested for a response. It may happen that some DUTs are non-operational, either at the start of the test or during the test at elevated temperature. In step 208, the test signal controller 102 shown in FIG. 2 may test each DUT to see if it responds. Upon completion, the test signal controller stores the total number, m, and position of DUTs that responded and are operational. If a DUT did not respond in step 208, it does not get heated or tested.

Assuming a DUT has responded, the heating elements of the socket holding that DUT receive a current to heat the DUT, depending on its temperature. The present technology may further include an electrical circuit configured to receive electrical current from the traces in the BIB 100 (or elsewhere) and supply current to one of the heating elements 130 when the latch heads 122 are clamped on top of the DUT 120. As embodiments include a heat element 130 in each of the two latch heads, there may be two separate electrical circuits, one for each of the heating elements.

Figure 9:
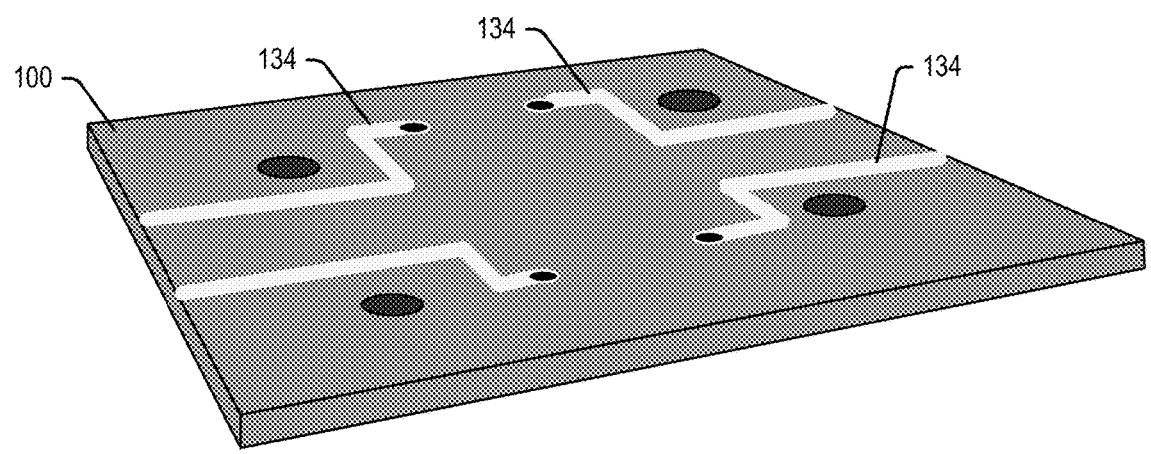
FIG. 9 is a perspective view of a portion of a burn-in board according to embodiments of the present technology.
Figure 13:
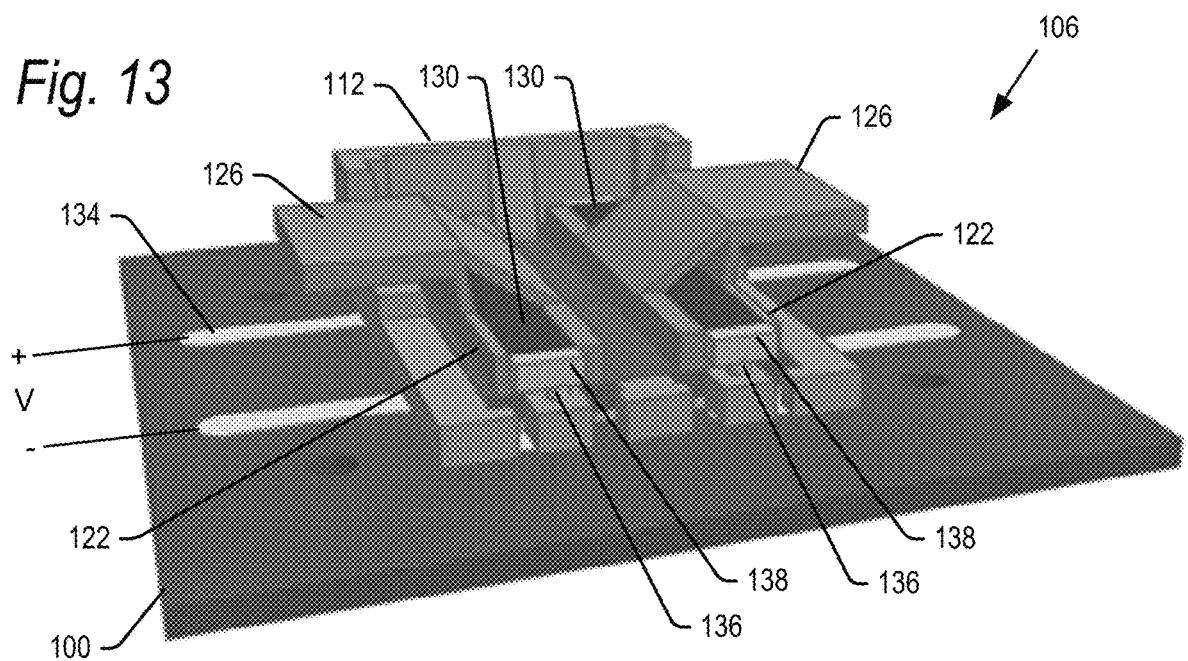
FIG. 13 is a perspective view of a portion of a socket mounted on a burn-in board with the latch heads in a closed position and the heating elements receiving a current according to embodiments of the present technology.

FIG. 9 is a perspective view of a portion of BIB 100 showing an area covered by a single socket 106. FIGS. 10-13 are plan and perspective views showing a socket 106 mounted on the BIB 100. The BIB 100 may include electrical traces 134 electrically coupled to the test signal controller 102. In one embodiment, the electrical circuit includes a pair of pogo pins 136 mounted for translation in the package insert guide 112. The electric circuits may further include a pair of terminals 138 on opposed ends of each latch head 122, which terminals are electrically coupled to the wires 132 connected to the heating elements 130. When the latch heads 122 are moved from their open positions (FIG. 11) to their closed positions on top of the DUT 120 (FIG. 12), the terminals 138 on each latch head 122 may contact a pair of pogo pins 136 on opposed sides of the package insert guide 112. The terminals 138 force the pogo pins 136 downward into contact with traces 134. Thereafter, current through traces 134 may flow through the heating elements 130 on each latch head 122 to heat the heating elements (FIG. 13).

In the above-described embodiment, power flows to the heating elements 130 when the latch heads 122 clamp down and move the pogo pins 136 into contact with traces 134 on the BIB 100. However, it is understood that current may be supplied to the heating elements 130 by other electrical circuits and by other schemes in further embodiments. FIGS. 14 and 15 show an embodiment of a socket 106 in the open and closed positions, respectively. In this embodiment, leads 140 are coupled to terminals 142 on opposed sides of the heat elements 130. The terminals 142 are in turn electrically connected to the heating element 130 in each latch head 122, as by a wire connecting the heating elements to the terminals 142 on opposed sides of the latch head 122. The leads 140 connect externally from the socket 106 to a current source, either through traces in the BIB 100 or externally from the BIB 100. Other schemes are contemplated for coupling the heating elements 130 in sockets 106 to a current source to heat the elements.

In embodiments, a steady state, predefined current may be applied uniformly to each heating element 130 in each socket 106 on each BIB 100. However, the embodiment described in the flowchart of FIG. 1 provides a closed loop feedback heating control system where temperature at each DUT may be independently regulated using varied current to individual sockets 106, depending on the temperature of the DUT 120 measured at the individual sockets.

In particular, where there are m number of total operational DUTs 120 on the one or more BIBs 100 in the oven (as determined in the contact testing step 208), the test signal controller 102 (FIG. 2) may successively examine each DUT from n=1 to m in step 212. In step 214, the controller 102 may measure the temperature at the $n^{th}$ DUT 120. In embodiments, each DUT may have an internal temperature sensor. If the DUT is operational, the DUT may relay temperature readings to the test signal controller 102 in step 214.

In step 220, power is supplied to the $n^{th}$ DUT 120 depending on the temperature measured in step 214. For example, if the $n^{th}$ DUT 120 is slightly below the target temperature for the burn-in test, a relatively small current may be supplied to slightly heat the heating elements 130 of the $n^{th}$ DUT 120. If the $n^{th}$ DUT 120 is significantly below the target temperature for the burn-in test, a relatively large current may be supplied to significantly heat the heating elements 130 of the $n^{th}$ DUT 120. If the $n^{th}$ DUT 120 is at or above the target temperature for the burn-in test, it is possible that no current be supplied. As noted, it is possible that a DUT 120 may fail the check performed in step 208, for example where the test signal controller 102 receives no temperature readings. In this instance, that DUT is skipped and not heated.

In the above-described embodiment, the temperature sensor is integrated into the DUT. In further embodiments, the temperature sensor may be a stand-alone temperature sensor at each socket 106. For example, FIG. 10 shows a schematic temperature sensor 146 mounted at a front edge of one of the latch heads 122. It is understood that a temperature sensor may be mounted at other portions of the socket 106 to provide real-time feedback of the temperature of the DUT 120 at each socket 106.

In step 224, the test signal controller 102 may perform test read/write operations on the $n^{th}$ DUT 120, and the results recorded by the test signal controller 102 in step 226.

In step 230, the controller 102 checks whether all DUTs 120 have been checked and tested (n=m?). If not, the controller increments n to the next DUT 120 in step 212, and steps 214, 218, 220, 224, 226 and 230 are repeated to check/adjust temperature at the $n^{th}$ DUT 120 and to test the $n^{th}$ DUT 120. If, on the other hand, all DUTs 120 have been tested in step 230, the controller 102 checks in step 232 whether testing of all DUTs 120 is to be repeated. If so, n is reset to the first DUT, and the flow returns to step 212 to again check/adjust temperature at the DUTs 120 and to test read/write operations on the DUTs 120. If, on the other hand, no further testing is to be performed in step 232, current to the heating elements 130 is shut off in step 236 and the operation of the controller ends.

As discussed in the Background section, many ovens use convective heating, where hot gas is forced in the from one or both edges of the BIB 100, which can result in uneven heating of the DUTs on the board. In accordance with aspects of the present technology, this problem is solved by providing local, onboard heaters at each DUT socket to ensure all DUTs are heated to the desired elevated temperature. Such elevated temperatures may range for example from 85° C. to 105° C., but may be other temperatures above room temperature. DUTs are heated by a combination of the local onboard heating elements and the convective oven heating. The onboard heating elements at each socket provide individual DUT temperature control compensating for any external temperature gradients created by the convective oven heating. In embodiments, the onboard heating elements 130 can heat DUTs up to 30° C. higher than the oven alone, though it may be more or less than this amount in further embodiments.

The present technology also provides a more efficient heat transfer mechanism than convective heating alone. The heating elements are adjacent to, or in direct contact with, the DUT, and heat is transferred in this way more efficiently than conducting heat through several material layers as in conventional convective heat burn-in testing.

Moreover, in the embodiment of the present technology described in the flowchart of FIG. 1, temperature of the DUTs 120 may be individually regulated at each socket 106 by sensing the temperature of each DUT 120 and providing a customized current based on the measured temperature. However, as noted, each socket 106 may instead be simply controlled such that each socket receives the same current at all times.

In a further embodiment, a temperature profile may be empirically developed showing the temperature of DUTs at different positions of the BIB 100. Based on that temperature profile, DUTs which receive less convective heating (i.e., at an edge or at the center of the BIB) may receive a constant current flow which is higher than current flow to BIBs which receive more convective heating.

In embodiments described above, each socket 106 includes a local, onboard heating element. In further embodiments, the BIB 100 may be broken down into zones, and only certain zones have onboard heating elements on the sockets in those zones, or only certain sockets within a zone have onboard heating elements.

In operation, some sockets 106 on a BIB 100 may include DUTs, while other sockets 106 are left empty. In embodiments of the present technology, only those sockets having DUTs receive current at their onboard heating elements so that those sockets without DUTs are not heated. This may be sensed by whether the upper socket 124 is closed or not, or by another sensor provided in the socket to determine whether a DUT is present.

Embodiments described above comprise a pair of opposed latch heads 122, each including a heating element 130. In further embodiments, it is conceivable that a heating element 130 be placed in only one of the opposed latch heads. In still further embodiments, the socket 106 may include only a single latch head which moves between an open position where a DUT may be inserted or removed, and a closed position clamping the DUT in place. In such an embodiment, the single latch head may include a heating element 130 as described above.

In summary, an example of the present technology relates to a burn-in board for testing of devices under test (DUTs) at elevated temperatures, comprising: a plurality of sockets configured to receive the DUTs; at least one latch head mounted in each socket of the plurality of sockets, the at least one latch head supported to move between an open position where a DUT may be inserted or removed from the socket, and a closed position where the at least one latch head clamps the DUT in the socket; and a heating element integrated into the at least one latch head, the heating element configured to heat the DUT.

In another example, the present technology relates to a socket configured to receive a device under test (DUT) in a burn-in board for testing the DUT at elevated temperatures, the socket comprising: a lower socket base mounted on the burn-in board; a pair of latch heads each configured to move between an open position where a DUT may be inserted or removed from the socket, and a closed position where the at least one latch head clamps the DUT in the socket; at least one heating element integrated into at least one latch head of the pair of latch heads, the at least one heating element configured to heat the DUT upon receipt of an electrical current; and an upper socket configured to move the pair of latch heads between the open and closed positions.

In a further example, the present technology relates to a burn-in board for testing of devices under test (DUTs) at elevated temperatures, comprising: a plurality of sockets configured to receive the DUTs; a pair of latch heads mounted in each socket of the plurality of sockets, the pair of latch heads each configured to move between an open position where a DUT may be inserted or removed from the socket, and a closed position where the pair of latch heads clamp the DUT in the socket; and heating means for heating the DUT in each latch head of the pair of latch heads.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A burn-in board for testing of devices under test (DUTs) at elevated temperatures, comprising:
    a plurality of sockets configured to receive the DUTs;
    at least one latch head mounted in each socket of the plurality of sockets, the at least one latch head supported to move between an open position where a DUT may be inserted or removed from the socket, and a closed position where the at least one latch head clamps the DUT in the socket; and
    a heating element integrated into the at least one latch head, the heating element configured to heat the DUT.

2. The burn-in board of claim 1, wherein the heating element is one of a resistor, a polyimide coil and a conductive wire.

3. The burn-in board of claim 1, wherein the heating element comprises a plurality of discrete resistors.

4. The burn-in board of claim 1, wherein the heating element is electrically coupled to traces in the burn-in board and is configured to receive an electrical current from the burn-in board.

5. The burn-in board of claim 1, further comprising:
    first and second terminals on opposed ends of the at least one latch head; and electrical connectors electrically coupling the heating element to the first and second terminals.

6. The burn-in board of claim 5, further comprising:
pogo pins mounted for translation in the socket and configured to move between a first position spaced from the burn-in board and a second position in contact with electrical traces in the burn-in board, the electrical traces being coupled to an electrical current source;
wherein the first and second terminals are configured to actuate the pogo pins from the first position to the second position when the at least one latch head moves from the open to the closed position, the heating element receiving an electrical current from the electrical current source when the first and second terminals actuate the pogo pins to the second position.

7. The burn-in board of claim 5, further comprising wires electrically coupled to the first and second terminals, the wires being coupled to an electrical current source.

8. The burn-in board of claim 1, wherein the at least one latch head comprises a pair of opposed latch heads, each of the latch heads in the pair of opposed latch heads comprising a heating element.

9. The burn-in board of claim 1, wherein the at least one latch head comprises a first surface configured to lie adjacent the DUT when the at least one latch head is in the closed position, and a second surface opposite the first surface, the at least one latch head further comprising a channel in the second surface for receiving the heating element.

10. The burn-in board of claim 1, further comprising a bore formed through the least one latch head, wherein the heating element is mounted within the bore.

11. The burn-in board of claim 1, wherein the heating element is mounted in the at least one latch head to lie in direct contact with the DUT when the at least one latch head is in the closed position.

12. The burn-in board of claim 1, further comprising a temperature sensor on or at the socket, the temperature sensor configured to provide temperature readings from the DUT to provide closed loop feedback heating control of the DUT.

13. A socket configured to receive a device under test (DUT) in a burn-in board for testing the DUT at elevated temperatures, the socket comprising:
a lower socket base mounted on the burn-in board;
a pair of latch heads each configured to move between an open position where a DUT may be inserted or removed from the socket, and a closed position where the at least one latch head clamps the DUT in the socket;
at least one heating element integrated into at least one latch head of the pair of latch heads, the at least one heating element configured to heat the DUT upon receipt of an electrical current; and
an upper socket configured to move the pair of latch heads between the open and closed positions.

14. The socket of claim 13, further comprising at least one electrical circuit coupled to the at least one heating element, the electrical circuit configured to supply current to the at least one heating element when the pair of latch heads are in the closed position.

15. The socket of claim 14, wherein the electrical circuit comprises:
first and second terminals connected to the at least one heating element, and
pogo pins mounted for translation in the socket and configured to move between a first position spaced from the burn-in board and a second position in contact with electrical traces in the burn-in board, the electrical traces being coupled to an electrical current source; and
wherein the first and second terminals are configured to actuate the pogo pins from the first position to the second position when the at least one latch head moves from the open to the closed position, the at least one heating element receiving an electrical current from the electrical current source when the first and second terminals actuate the pogo pins to the second position.

16. The socket of claim 13, further comprising an interposer having a first set of contacts on a first side configured to mate with burn-in board contacts on the burn-in board, and a second set of contacts on a second side configured to mate with DUT contacts on the DUT, the interposer configured to transfer signals between the DUT and burn-in board when the at least one latch head clamps the DUT in the socket.

17. The socket of claim 13, wherein the at least one heating element comprises a pair of heating elements, one heating element in each of the pair of latch heads.

18. The socket of claim 13, wherein the at least one heating element is mounted on a surface of the at least one latch head adjacent the DUT when the at least one latch head is in the closed position.

19. The socket of claim 13, wherein the at least one heating element is mounted on a surface of the at least one latch head most distal from the DUT when the at least one latch head is in the closed position.

20. A burn-in board for testing of devices under test (DUTs) at elevated temperatures, comprising:
a plurality of sockets configured to receive the DUTs;
a pair of latch heads mounted in each socket of the plurality of sockets, the pair of latch heads each configured to move between an open position where a DUT may be inserted or removed from the socket, and a closed position where the pair of latch heads clamp the DUT in the socket; and
heating means for heating the DUT in each latch head of the pair of latch heads.

* * * * *